(12) United States Patent
Hildebrand et al.

(10) Patent No.: US 12,302,539 B2
(45) Date of Patent: May 13, 2025

(54) ELECTRONIC DEVICE WITH ACTIVE COOLING

(71) Applicant: Continental Automotive Technologies GmbH, Hannover (DE)

(72) Inventors: Bernd Hildebrand, Rodgau (DE); Georg Nehm, Niedernberg (DE)

(73) Assignee: Continental Automotive Technologies GmbH, Hannover (DE)

( * ) Notice: Subject to any disclaimer, the term of this patent is extended or adjusted under 35 U.S.C. 154(b) by 127 days.

(21) Appl. No.: 17/965,944

(22) Filed: Oct. 14, 2022

(65) Prior Publication Data

US 2023/0121655 A1 Apr. 20, 2023

(30) Foreign Application Priority Data

Oct. 14, 2021 (DE) ..................... 10 2021 211 599.3

(51) Int. Cl.
*H05K 7/20* (2006.01)
(52) U.S. Cl.
CPC ................. *H05K 7/20909* (2013.01)
(58) Field of Classification Search
CPC ........... H05K 7/20909; H05K 7/20136; H05K 7/20145; H05K 7/20163; H05K 7/20172
See application file for complete search history.

(56) References Cited

U.S. PATENT DOCUMENTS

| | | | | |
|---|---|---|---|---|
| 6,348,748 | B1 * | 2/2002 | Yamamoto | F04D 29/424 310/67 R |
| 6,606,242 | B2 * | 8/2003 | Goodman | G06F 1/184 248/633 |
| 6,847,524 | B2 * | 1/2005 | Tomioka | H05K 7/20154 257/722 |
| 7,447,030 | B2 * | 11/2008 | Hwang | F28D 15/0266 165/122 |

(Continued)

FOREIGN PATENT DOCUMENTS

| | | |
|---|---|---|
| DE | 202016008394 U1 | 10/2017 |
| DE | 102018208698 A1 | 12/2018 |
| DE | 102018120053 A1 | 3/2019 |

OTHER PUBLICATIONS

Search Report dated Jul. 19, 2022 from corresponding German patent application No. 10 2021 211 599.3.

(Continued)

*Primary Examiner* — Mandeep S Buttar
*Assistant Examiner* — Matthew Sinclair Muir

(57) ABSTRACT

The disclosure relates to an electronic device with active cooling. In order to make a compact design of an electronic device possible and furthermore ensure a high level of ESD/EMC protection and a high level of IP protection, it is proposed according to the disclosure that a housing of the electronic device is connected to a main body of a fan. When the main body and housing are in a connected state, an opening to the interior of the housing is closed off. The main body is furthermore connected to a bushing on which the fan (Continued)

rotor is mounted for rotation. In the connected state, a chamber is furthermore formed which is separated from the interior of the housing and in which the fan rotor is arranged. Here, the chamber forms a housing for the fan rotor.

12 Claims, 4 Drawing Sheets

(56) References Cited

U.S. PATENT DOCUMENTS

| | | | |
|---|---|---|---|
| 7,684,187 B1* | 3/2010 | Meyer, IV | H01L 23/467 |
| | | | 361/679.52 |
| 8,897,002 B2* | 11/2014 | Degner | G06F 1/1658 |
| | | | 361/679.52 |
| 2008/0062645 A1* | 3/2008 | Lijima | G06F 1/203 |
| | | | 361/695 |
| 2013/0010427 A1* | 1/2013 | Lin | H01R 13/743 |
| | | | 361/695 |
| 2020/0029472 A1* | 1/2020 | Rakoczi | H05K 7/20881 |
| 2021/0120699 A1* | 4/2021 | Lim | F04D 29/4226 |
| 2021/0216119 A1 | 7/2021 | Kuo et al. | |
| 2021/0265718 A1* | 8/2021 | Kuo | H05K 7/20172 |
| 2022/0049714 A1* | 2/2022 | Haaf | F04D 27/009 |
| 2022/0192058 A1* | 6/2022 | Kim | H05K 7/20909 |

OTHER PUBLICATIONS

Extended Search Report dated Mar. 3, 2023 from corresponding European patent application No. 22199175.5.

\* cited by examiner

ELECTRONIC DEVICE WITH ACTIVE COOLING

CROSS REFERENCE TO RELATED APPLICATIONS

This U.S. patent application claims the benefit of German patent application No. 10 2021 211 599.3, filed Oct. 14, 2021, which is hereby incorporated by reference.

TECHNICAL FIELD

The present disclosure relates to an electronic device having a housing and having at least one electronic component for cooling, which electronic component is arranged on a device circuit board in the interior of the housing. At least one of the electronic components is used to implement the functionality of the electronic device.

BACKGROUND

For the dissipation of heat that is generated as a result of power losses at electronic parts or electronic components, active convection solutions with forced air movement by fans are known from the prior art. In the solutions known from the prior art, fans are generally installed as a complete assembly, that is to say together with fan housing, cable and plug connector, within or on the outside of device housings.

If the fan is situated within the housing, the air flow is conducted through the device, and the dissipation of heat from the components takes place directly by way of the air stream. In this case, dust, dirt, moist air and/or liquids may pass into the interior of the device with the air flow. These may contaminate the electronic parts, which in turn may lead to malfunctions, for example owing to electromigration.

If the fan is fastened to the device from the outside, the air flow takes place outside the device, wherein the removal of heat from the parts from which heat is to be dissipated normally takes place by way of thermal coupling to a housing by a thermally conductive material, and the removal of heat to the ambient air takes place via external cooling fins. Here, it is a problem that a mechanical safeguard for preventing touching of a fan rotor is required as an additional constituent. Furthermore, the electrical contacting by a cable connection and plug connector is normally performed by way of a cumbersome manual cable laying and contacting process. This entails additional expenditure on components with associated additional parts costs, and additional expenditure on assembly steps with associated additional costs for the assembly process. Additionally, the fan housing constituents and the electrical connection by a cable and plug connector additionally occupy installation space, which restricts the utilization of the available device installation space.

A fan commonly has a moving rotating part, the fan rotor, and a fixed part, the stator. At least one electrical connection for the stator is required for the operation of the fan. For this purpose, two lines are provided, a ground connection and a voltage connection. Furthermore, in the case of modern fans, use is always also made of a third line for a rotational speed sensor arrangement and thus for the determination of the rotational speed of the fan. Additionally, PWM (pulse width modulation) fans, which are provided in particular for cooling a CPU, also have a fourth line. Said fourth line is utilized for the electronics of the rotational speed controller. Here, fan electronics and a fan sensor arrangement are typically installed on a fan circuit board, which limit the installation space of the fan.

In order, in the case of fans installed within a housing, to prevent dust, dirt, moist air and/or liquids from passing into the interior of the device with the air flow and thus being able to damage electronic components, solutions are already known from the prior art in which specifically designed air flow guides are laid through the housing in a cumbersome manner. Furthermore, solutions are known in which the air that is drawn in is filtered before passing into the interior of the housing. All of this however entails additional expenditure on components and additional assembly steps, each with associated additional costs.

Furthermore, not only is it important for electronic components within the housing to be protected against the ingress of dust, dirt, moist air and/or liquids, but they must likewise be protected against the infiltration of electromagnetic radiation. This is known as EMC (electromagnetic compatibility) protection.

DE 10 2018 120 053 A1, for example, is known. In detail, the document describes an electronic device with an axial fan and with a housing that has a heat sink with cooling fins. The axial fan is accommodated in a receiving space of the housing, which receiving space has openings at both sides, such that air is drawn in on one side and is discharged to the other, opposite side. The cooling fins are arranged, spaced apart from the receiving space that encloses the fan, on the side at which the air is discharged from the axial fan. Here, the axial fan is accommodated as an entire assembly, that is to say together with fan housing, in the receiving space. The fan housing is intended to ensure that an opening into the interior of the housing, which opening is present in the receiving space, is substantially closed. It is intended in this way to prevent dust, dirt, moist air and/or a liquid from being able to pass into the interior of the electronic device and thus to electronic components. DE 10 2018 120 053 A1 however also discloses that complete sealing of the receiving space with respect to the interior of the housing is possible only if, around the fan housing, there is additionally arranged a frame, sealing element or the like which seals with respect to the inner contour of the receiving space. In order to protect the interior against an ingress of dust, dirt, moist air and/or a liquid, an increased space requirement for the fan is necessary owing to the required fan housing. Furthermore, an additional sealing element must be used in order to also actually ensure that, even with a fan housing, no dust, dirt, moist air and/or liquid can pass into the interior of the electronic device. Depending on the composition of the fan housing, which is typically composed of plastic, and of the sealing element, electromagnetic radiation that infiltrates into the receiving space through the openings at both sides can additionally also infiltrate into the interior of the housing. Adequate EMC protection is then no longer ensured.

It is therefore an object of the present disclosure to provide an electronic device with active cooling, which overcomes at least one of the above-stated disadvantages. In particular, it is an object of the present disclosure to provide an electronic device with active cooling, which allows a compact design and furthermore a high level of ESD (electrostatic discharge)/EMC protection and a high level of IP (ingress protection) protection, to ensure protection against an ingress of dust, dirt, moist air, liquids and/or safeguarding against touching.

SUMMARY

According to the present disclosure, the housing of the electronic device is connected to a main body of a fan. Here, the fan has no additional dedicated fan housing, such as a plastics housing. The fan therefore likewise does not have any housing part which is formed by the fan and which regionally encloses the fan blades of the fan rotor in any way. The main body is therefore not to be confused with a dedicated fan housing belonging to the fan. The main body is for example of plate-like configuration. The main body is for example composed of one or more plastics. When the main body and housing are in a connected state, an opening to the interior of the housing is closed off. When the main body and housing are in the connected state, a chamber is furthermore formed in the housing, which chamber is separated from the interior of the housing. Furthermore, the main body is connected to a bushing on which the fan rotor of the fan is mounted for rotation. Here, the bushing forms an elevation that protrudes from the main body. In order to contribute to a compact design, the main body and the housing are connected to one another and arranged relative to one another such that the axis of rotation of the fan rotor runs in a direction perpendicular to the direction of extent of a region, to which the main body is connected and on which a heat sink is arranged, of the housing. Here, during an assembly process, the main body and housing are connected from an inside of the housing, that is to say through a region in which the device circuit board is arranged. Therefore, in one step during an assembly process, a connection between main body and housing is firstly produced such that the chamber is formed, and the fan rotor is arranged in the chamber. Then, in a subsequent step, the device circuit board is arranged in a region of the electronic device that forms the interior of the housing. Owing to the configuration of the chamber and the specified assembly direction, this may be kept small overall, and the electronic device may be made very compact. When the main body and housing are in the connected state, the fan rotor is arranged within the chamber. The chamber or the housing of the electronic device is configured such that, when connected to the main body, the electronic device forms a housing for the fan rotor. In this way, as already discussed above, a dedicated fan housing is omitted, and an air inlet and air outlet may be designed freely. The air inlet and air outlet are formed by way of the housing geometry of the electronic device in the chamber, whereby an air flow may be guided in targeted fashion by way of the housing geometry. In this way, it is for example possible for flow noises of the fan to be reduced. By virtue of the fact that the chamber is separated from the interior of the housing, a spatial separation from the interior of the housing and from the region in which the fan rotor is arranged is furthermore realized. In this way, device circuit boards and electronic components in the interior of the housing may be effectively and easily protected against an ingress of dust, dirt, moist air and liquids, and against an infiltration of electromagnetic radiation. Through the configuration of the chamber, and by virtue of the fact that a dedicated fan housing is omitted, it is possible overall to achieve a compact configuration of an electronic device. Furthermore, the chamber is configured overall such that it serves as a region for guiding and generating the air flow through the fan, is at the same time encapsulated with respect to electronic components situated in the interior of the housing, and, as a cover, protects against mechanical encroachment.

The bushing is configured such that the fan rotor is mounted for rotation on the bushing. Here, the bushing may be configured as a bearing or may have a bearing, such that the fan rotor may be mounted for rotation on the bushing. In one embodiment of the present disclosure, a connection of bushing and main body is realized by way of a fastener. For example, as a fastener, use may be made of adhesion and/or screw and/or rivet and/or clamping and/or detent. Such an embodiment, in which the bushing and main body are configured as two parts and must be connected by way of a fastener, the bushing may be of standardized design, and the main body may be of device-specific design. Production costs may be reduced in this way. In one embodiment of the present disclosure, the bushing and main body are configured as a single piece. A single-piece configuration contributes to a simplification and improvement in achieving ESD/EMC protection and protection against an ingress of dirt, dust and/or the like. A single-piece configuration furthermore reduces assembly steps during a process of assembly of the fan or of the electronic device.

In one embodiment of the present disclosure, the main body is composed of an electrically conductive material. The main body may for example be composed of a metal, for example a metal sheet. The main body is for example composed of an electrically conductive plastic. The use of an electrically conductive material additionally has an effect on EMC protection. Furthermore, a main body that is composed of a plastic with electrically conductive characteristics may additionally also have heat-conducting characteristics. A dissipation of heat may be additionally promoted in this way.

In one embodiment of the present disclosure, there is a direct connection between main body and housing. A direct connection of main body and housing is realized for example by way of a fastener that directly connects the main body and housing to one another. For example, as a fastener, use may be made of adhesion and/or screw and/or rivet and/or clamping and/or detent. It is self-evident that, in this embodiment, an opening to the interior of the housing is closed off by the main body.

In one embodiment, the main body and the housing have an electrically conductive connection. The connection between main body and housing may be realized for example by way of a screw connection, clamping connection, rivet connection, clip connection, calked connection, detent connection, welded connection or the like. In particular in the case of an embodiment in which the main body is composed of an electrically conductive material and substantially encircling electrical contact is thus produced between main body and housing, an electrically conductive connection between main body and housing may have an effect on ESD/EMC protection.

In one embodiment of the present disclosure, the main body and the housing have an electrically conductive adhesive connection. The electrically conductive adhesive connection for example additionally has acoustically damping characteristics. For example, the electrically conductive adhesive connection may be of electrically conductive configuration and be of elastomer consistency. The adhesive connection may then additionally ensure and/or contribute to acoustic decoupling of the fan with respect to the housing.

In one embodiment of the present disclosure, the main body is composed of an injection-molded component. In one embodiment of the present disclosure, the main body is composed of a multi-constituent injection-molded component. The main body is for example composed of a plastics component produced in a multi-constituent injection molding process. An embodiment as a multi-constituent injection-molded component offers a simple means of forming a main body with different physical characteristics. For example, it is thus possible for a single-piece main body to be formed, having a first injection-molded constituent that has electrically conductive characteristics and having a second injection-molded constituent that has electrically conductive characteristics and acoustically damping characteristics. For example, the first injection-molded constituent has an electrically conductive and thermally conductive material, for example an electrically conductive and thermally conductive plastic, for example polycaprolactam. The second injection-molded constituent preferably has an electrically conductive and acoustically damping material, for example a thermoplastic and electrically conductive elastomer. A main body may thus be individually adapted to an electronic device and a housing. It is self-evident that the main body and bushing may be configured as a single piece, and the bushing may be formed for example from a plastic that does not have electrically conductive characteristics. Materials may thus be optimally used, which additionally contributes to a cost saving.

In one embodiment of the present disclosure, there is an indirect connection between main body and housing. An indirect connection of main body and housing is present if an adapter element is additionally incorporated between main body and housing. The connection of main body and housing then takes place via the adapter element. The main body is then connected to the adapter element, and the adapter element is connected to the housing. The adapter element is connected to the housing by way of a fastener, for example by way of an adhesion and/or screw and/or rivet and/or clamping and/or detent. The main body is connected to the adapter element by way of a fastener, for example by way of an adhesion and/or screw and/or rivet and/or clamping and/or detent. It is self-evident that, in this embodiment, an opening to the interior of the housing is substantially closed off by the adapter element. The adapter element is for example of substantially plate-like or ring-shaped configuration. The adapter element is for example composed of one or more plastics and produced in an injection molding process, multi-constituent injection molding process, or assembly process. It is self-evident that the adapter element and main body may be produced from different materials with different physical characteristics. For example, the main body may be produced from an electrically conductive plastic, and the adapter element may be composed of an electrically conductive and an elastomer material with acoustically damping characteristics. The connection of main body and housing may furthermore be simplified by way of the adapter element. A preconfigured fan assembly that has a main body, a bushing, a fan rotor, a stator, a fan sensor arrangement and optionally a fan circuit board with fan electronics may thus be standardized. Furthermore, the main body, in an embodiment with an adapter element and as part of a fan assembly, may be dimensioned to be smaller overall, whereby material of a main body may be saved for example in the case of a standardized fan assembly. Then, only the adapter element is adapted in a device-specific manner.

In one embodiment of the present disclosure, the adapter element is composed of a multi-constituent injection-molded component with a first portion and with a second portion. Here, the first portion has an electrically conductive and thermally conductive material, for example an electrically conductive and thermally conductive plastic, for example polycaprolactam. The second portion has an electrically conductive and acoustically damping material, for example a thermoplastic and electrically conductive elastomer. The first and the second portion are for example of plate-like configuration. Optionally, at least one of the two portions may be of ring-shaped configuration.

The main body for example has a receiving region on which the bushing is arranged and which is furthermore configured such that the stator, and optionally a fan sensor arrangement, may also be arranged thereon. The bushing may optionally be configured as a holder for the stator. The stator and optionally the fan sensor arrangement, for example in the form of Hall sensors, are thus likewise situated, like the fan rotor, in a region that is separated from the interior of the housing. Optionally, the receiving region may also be configured for receiving a fan circuit board.

In one embodiment of the present disclosure, the fan, or the fan rotor, the stator and/or the fan sensor arrangement are arranged on the bushing and/or a receiving region of the main body. It is self-evident that the fan rotor is mounted for rotation on the bushing. A fan circuit board with fan electronics is for example also arranged on the main body, at a receiving region of the main body. In one embodiment of the present disclosure, the fan circuit board is arranged on a side of the main body that is directed into the chamber. This makes contacting and installation of the fan on the main body particularly straightforward. In an alternative embodiment of the present disclosure, the fan circuit board is arranged on a side of the main body that is directed into the interior of the housing after the main body and housing have been connected. The embodiments described in conjunction with the arrangement of the fan components allow the corresponding fan components to be preassembled on the main body. Standardization and scalability of a fan assembly that has a fan rotor, a stator, a fan sensor arrangement, a bushing, a main body and optionally a fan circuit board with fan electronics are furthermore possible. Furthermore, these embodiments allow simplified assembly of the fan assembly as a whole within the electronic device.

In one embodiment of the present disclosure, at least one electronic component of the fan is arranged in the interior of the housing. As electronic components of the fan, consideration is given here in particular to electronic components of the rotational speed controller. The installation of electronic components of the fan into the interior of the housing offers that the installation space of the fan itself may be reduced. In particular, the chamber in which the fan rotor is arranged may thus be made more compact. Furthermore, components that are arranged in the interior of the housing may additionally be better protected against dust, dirt, moist air and/or liquids. Furthermore, electronic components in the interior of the housing may additionally be better protected against the infiltration of electromagnetic radiation.

In one embodiment the present disclosure, at least one electronic component of the fan, in particular a component of the fan electronics, is installed onto the device circuit board. For example, owing to the integration of the control electronics of the fan onto the device circuit board, a reduction in the number of contacts of the electrical connection of fan to device circuit board, and a minimization of the fan installation space, may be achieved. In one embodiment of the present disclosure, the fan electronics are arranged in their entirety on the device circuit board. The fan circuit board may thus be omitted entirely. By virtue of the fan electronics being relocated into or onto the device circuit board, only three robust current-conducting lines are required. The evaluation of the rotor position and rotational speed for control purposes may furthermore be performed in an existing processor on the device circuit board, which additionally contributes to a cost reduction.

In one embodiment of the disclosure, the fan is configured as an axial fan. In one embodiment of the present disclosure, the fan is configured as a diagonal fan. In one embodiment of the disclosure, the fan is configured as a radial fan. Here, the axis of rotation of the fan rotor of the respective fan for example runs in a direction perpendicular to the direction of extent of a region, to which the main body is connected and on which the heat sink is arranged, of the housing. By virtue of the fact that the axis of rotation of the fan rotor of the respective fan runs perpendicular to the direction of extent of a region, to which the main body is connected and on which the heat sink is arranged, of the housing, a particularly compact and shallow construction of the electronic device may be ensured.

In one embodiment of the present disclosure, the axis of rotation of the fan is arranged perpendicular to the device circuit board of the electronic device. The electrical contacting of the fan with the device circuit board may thus be simplified, for example by way of push-in contacting.

The heat sink for example has at least one cooling fin, for example multiple cooling fins arranged parallel to one another. The fan and heat sink are then arranged and configured such that the air stream generated by the fan rotor flows over the one cooling fin or the multiple cooling fins arranged parallel to one another.

In one embodiment of the present disclosure, the housing and heat sink are configured as a single piece. In a further embodiment of the present disclosure, the heat sink is, as a separate component, connected in heat-conducting fashion to the housing. The housing and heat sink may be composed of a metal or of a metal alloy, for example an aluminum or magnesium alloy, and formed for example as metallic cast parts. For example, the two parts may be produced in separate aluminum die casting processes or magnesium die casting processes or, for a single-piece embodiment, produced in one common aluminum die casting process or magnesium die casting process. Alternatively, the housing and/or the heat sink may be produced from one or more plastics with different physical characteristics. For example, the housing and/or the heat sink may be produced in an injection molding process, for example in a multi-constituent injection molding process. It is particularly preferable if at least the heat sink is composed of a plastic with heat-conducting characteristics. The plastic of the heat sink may additionally also have electrically conductive characteristics.

In one embodiment of the present disclosure, the chamber is designed so as to form, for the fan, an air inlet from a direction parallel to the axis of rotation of the fan rotor and an air outlet substantially perpendicular to the axis of rotation of the fan rotor, and wherein the heat sink is arranged at the air outlet. This type of configuration of the chamber allows efficient air stream guidance along with a simultaneously very compact design of the electronic device.

In a further embodiment of the present disclosure, to form the chamber, the housing has a wall, which partially encircles the fan rotor, and a cover. Here, the wall has at least one aperture at a location at which the heat sink is arranged. The at least one aperture forms an air outlet for the air flow guide of the fan. The cover comes to lie on the wall. The cover has a multiplicity of openings that form an air inlet for the air flow guide of the fan. Here, the openings in the cover may be of any desired shape and may be composed for example of slots, polygonal openings and/or circular holes. Here, the design of the openings is not restricted to any geometry and may be selected taking into consideration the air flow guidance through the openings and/or with regard to acoustic aspects. It is self-evident that the housing, wall and cover are configured as a single piece. The wall and cover are therefore integrally connected to one another. The air flow guide for the fan is determined by the design of the wall and cover. This embodiment makes an air flow guide possible which is such that a fan rotor draws in air from a direction parallel to its axis of rotation and discharges the drawn-in air via the at least one aperture in the wall, which at least one aperture is situated in a direction substantially perpendicular to the axis of rotation of the fan rotor, that is to say in a radial direction of the fan rotor. The air stream generated by the fan rotor is thus guided over the heat sink, which is arranged so as to adjoin the aperture that forms the air outlet.

In a further embodiment of the present disclosure, to form the chamber, the housing has a cover that comes to lie at or on cooling fins, which are arranged at the air outlet, of the heat sink. The cover furthermore has a multiplicity of openings that form the air inlet. It is self-evident that, in this embodiment, the cooling fins, heat sink and cover are integral constituent parts of the housing. The cooling fins are integrally connected to the cover. The chamber is then formed substantially by cooling fins, the cover and the connection of main body and housing. This embodiment contributes to an even more compact design of an electronic device according to the disclosure. It is self-evident that, in this embodiment, there is no need for a partially encircling wall. For example, the cooling fins may be arranged radially in all directions of the chamber. A partially encircling wall may however be formed in this embodiment for example by cooling fins that are an integral constituent part of the housing.

In a further embodiment of the present disclosure, the chamber is arranged between cooling fins of the heat sink. Here, the cooling fins adjoin the chamber and extend from the chamber in two opposite directions perpendicular to the axis of rotation of the fan rotor. Here, the heat sink is configured as an integral constituent part of the housing, and the cooling fins are configured as multiple cooling fins, arranged parallel to one another, of the heat sink. This embodiment cools over a large area. It is thus possible for multiple electronic components in the interior of the housing to be actively cooled simultaneously, or for more heat to be transported away simultaneously. The air stream generated by the fan may thus be optimally used for cooling electronic components arranged to several sides of the chamber in the interior of the housing.

The electronic device according to the disclosure may in principle be used wherever heat dissipation is to be performed by forced convection by way of an air flow provided by means of a fan and it is sought to satisfy increased demands on EMC/ESD and IP protection in a simple and inexpensive manner. In particular, it is the intention for the disclosure to be used in electronic devices in a vehicle, for example for high-performance computers or head-up displays that are installed in vehicles.

Further features of the present disclosure will become apparent from the following description and the appended claims in conjunction with the figures.

DETAILED DESCRIPTION

For a better understanding of the principles of the present disclosure, embodiments of the disclosure will be explained in more detail below with reference to the figures. The same reference signs will be used in the figures for identical or functionally identical elements and are not necessarily described again for each figure. It is to be understood that the disclosure is not restricted to the illustrated embodiments and that the features described can also be combined or modified without departing from the scope of protection of the disclosure as defined in the appended claims.

Figure 1:
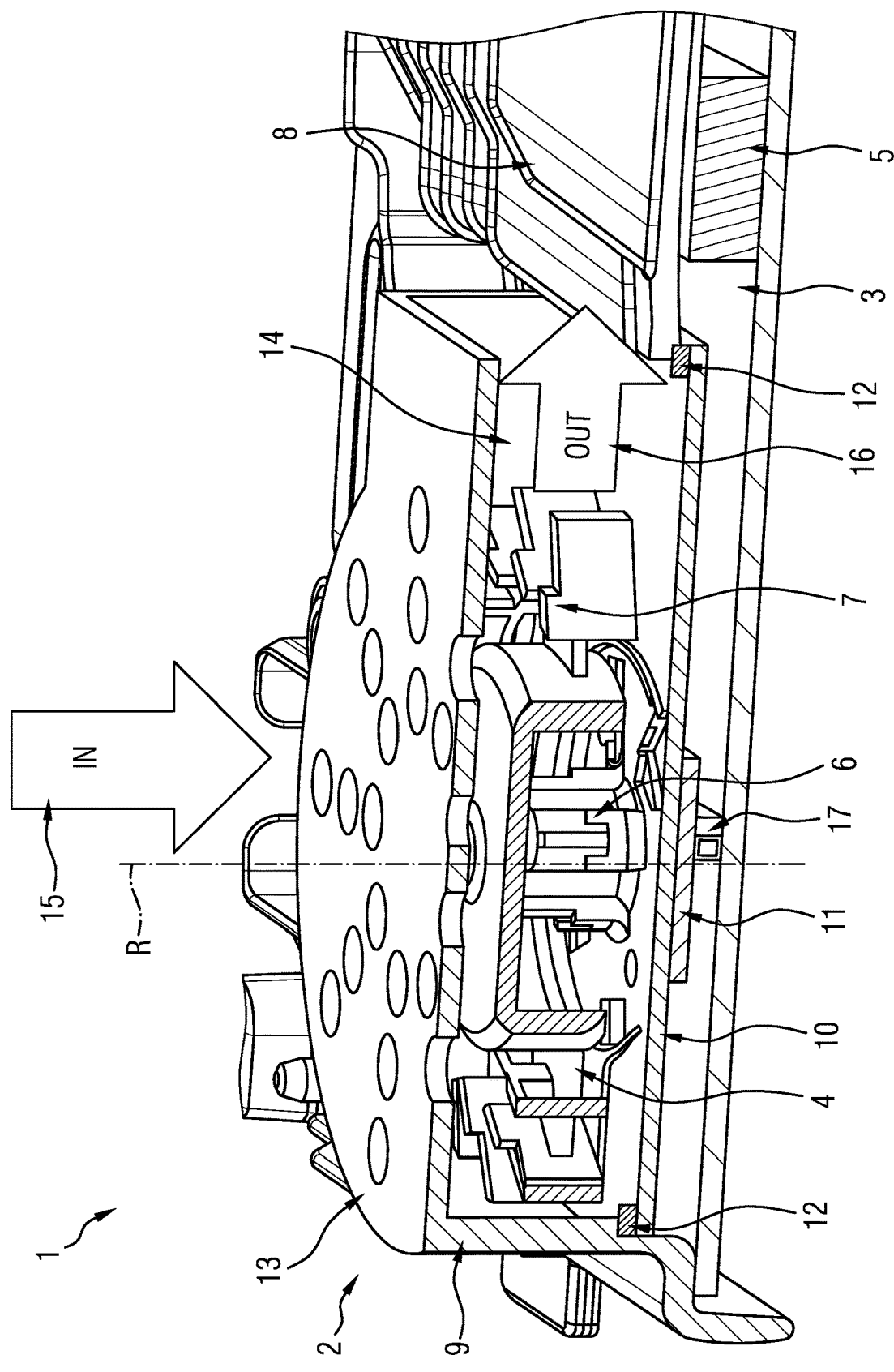
FIG. 1 schematically shows a first embodiment of an electronic device according to the disclosure.

FIG. 1 is a schematic illustration of a first embodiment of an electronic device 1 according to the disclosure. The electronic device 1 has a housing 2, a device circuit board 3, a heat sink 8 with cooling fins, and a fan 4, which is configured as a radial fan.

The device circuit board 3 is arranged in the interior of the electronic device 1 and has an electronic component 5 that implements the function of the electronic device 1.

The heat sink 8 is formed integrally with the housing 2, though the heat sink 8 may alternatively also be configured as a separate component and connected in heat-conducting fashion to the housing 2. The heat sink 8 and electronic component 5 are arranged relative to one another such that the heat sink 8 absorbs heat from the electronic component 5. For this purpose, the heat sink 8 and the electronic component 5 have a thermal coupling.

The fan 4 has a plate-like main body 10, a bushing 6, a fan rotor 7, a stator (not illustrated), Hall sensors (not illustrated), and a fan circuit board 11, on which the fan electronics are arranged. The fan 4 that is used here is a PWM fan. The bushing 6 and main body 10 have in this case been produced as a single piece from an electrically conductive plastic in an injection molding process. Alternatively, the bushing 6 and main body 10 may also be configured as two parts and connected to one another using fastening means. In a two-part configuration, the bushing 6 may be produced from a relatively inexpensive plastic without special electrically conductive characteristics. The plate-like main body 10 has a depression that is configured as a receiving region for a stator (not illustrated) and the bushing 6. The bushing 6 serves for the rotatable mounting of the fan rotor 7, projects at one side out of the depression, and receives the stator in the receiving region.

The main body 10, bushing 6, fan rotor 7, stator, Hall sensors and the fan circuit board 11, on which the fan electronics are arranged, together form a fan assembly. The fan assembly is already preconfigured such that, already before the individual fan components are installed into the electronic device 1, the fan components are arranged on the main body 10. Here, a connection of the main body 10 to the housing 2 is realized here by way of a region which forms the interior of the housing 2 and in which the device circuit board 3 is arranged. The entire preconfigured fan assembly is thus arranged in the electronic device 1. The main body 10 and housing 2 are in this case connected to one another directly, that is to say without a further adapter element between main body 10 and housing 2, by way of a fastener. Here, the connection of main body 10 and housing 2 is an electrically conductive connection. The fastener corresponds to an electrically conductive adhesive, in this case a fully encircling electrically conductive and acoustically damping adhesive connection 12 at a connection point between main body 10 and housing 2. The housing 2 and the heat sink 8 are composed of an aluminum alloy or a magnesium alloy and are produced in a die casting process. Alternatively, the housing 2 and the heat sink 8 may be composed of a thermally conductive plastic and produced for example in an injection molding process or multi-constituent injection molding process.

The housing 2 of the electronic device 1 has a wall 9, which partially encircles the fan rotor 7, and a cover 13, which comes to lie on the wall 9. The wall 9 and cover 13 are in this case formed integrally with the housing 2. These, together with the main body 10 when the main body 10 and housing 2 are in a connected state, form a chamber 14 within which the fan rotor 7, the stator and the Hall sensors are arranged. At a location at which the heat sink 8 is arranged, the wall 9 has an aperture that forms an air outlet 16. The cover 13 furthermore has a multiplicity of circular openings that form an air inlet 15 in the chamber 14. During the operation of the fan 4, the rotation of the fan rotor 7 causes air to be drawn in via the openings in the cover 13, which form the air inlet 15, from a direction parallel to the axis of rotation R of the fan rotor 7. Then, via the opening in the wall 9 that forms the air outlet 16, the air stream generated by the fan rotor 4 is discharged in a direction substantially perpendicular to the axis of rotation R of the fan rotor 7. The air stream is discharged such that it flows over or along multiple cooling fins, which are arranged parallel to one another, of the heat sink 8, which is arranged so as to adjoin the aperture. The chamber 14, the fan rotor 7 and the heat sink 8 are in this case configured and arranged relative to one another such that the air stream flows over as large an area as possible of the heat sink 8. The chamber 14 therefore projects in the direction of the aperture slightly beyond the extent of the fan rotor 7, such that the air flow that is generated flows as far as possible as a laminar flow, without turbulence, over the heat sink 8 or the cooling fins. The axis of rotation R of the fan rotor 4 is arranged perpendicular to the device circuit board 3 of the electronic device 1 and runs in a direction perpendicular to the direction of extent of a region, to which the main body 10 is connected and on which the heat sink 8 is arranged, of the housing 2.

When the main body 10 and housing 2 are in a connected state, the main body 10 closes an opening to the interior of the housing 2. In this way, the bushing 6, the fan rotor 7, the stator and the Hall sensors are arranged in the chamber 14, and in this in a region that is separated from the interior of the housing 2. Furthermore, the chamber 14, or the wall 9, the cover 13 and the main body 10 form a housing for the fan rotor 7.

The fan circuit board 11 on which the fan electronics, in this case the rotational speed controller, are/is situated is arranged on a side of the main body 10 that is situated toward the inside of the housing 2. In this way, electronic components of the fan 4 are arranged in the interior of the housing 2. The fan circuit board 11 and the device circuit board 3 are mechanically and electrically contacted with one another via a plug connection 17, for example a board to board plug connection. Alternatively, the fan circuit board 11 and the device circuit board 3 may for example also be electrically and/or mechanically connected to one another by way of a cable connection and/or plug connection and/or detent connection and/or a connection by way of a one-piece connector. Optionally, at least one of the electronic components of the fan 4 is installed onto the device circuit board 3. Optionally, all of the electronic components of the fan 4 are installed onto the device circuit board 3, such that the fan circuit board 11 can be omitted.

Figure 2:
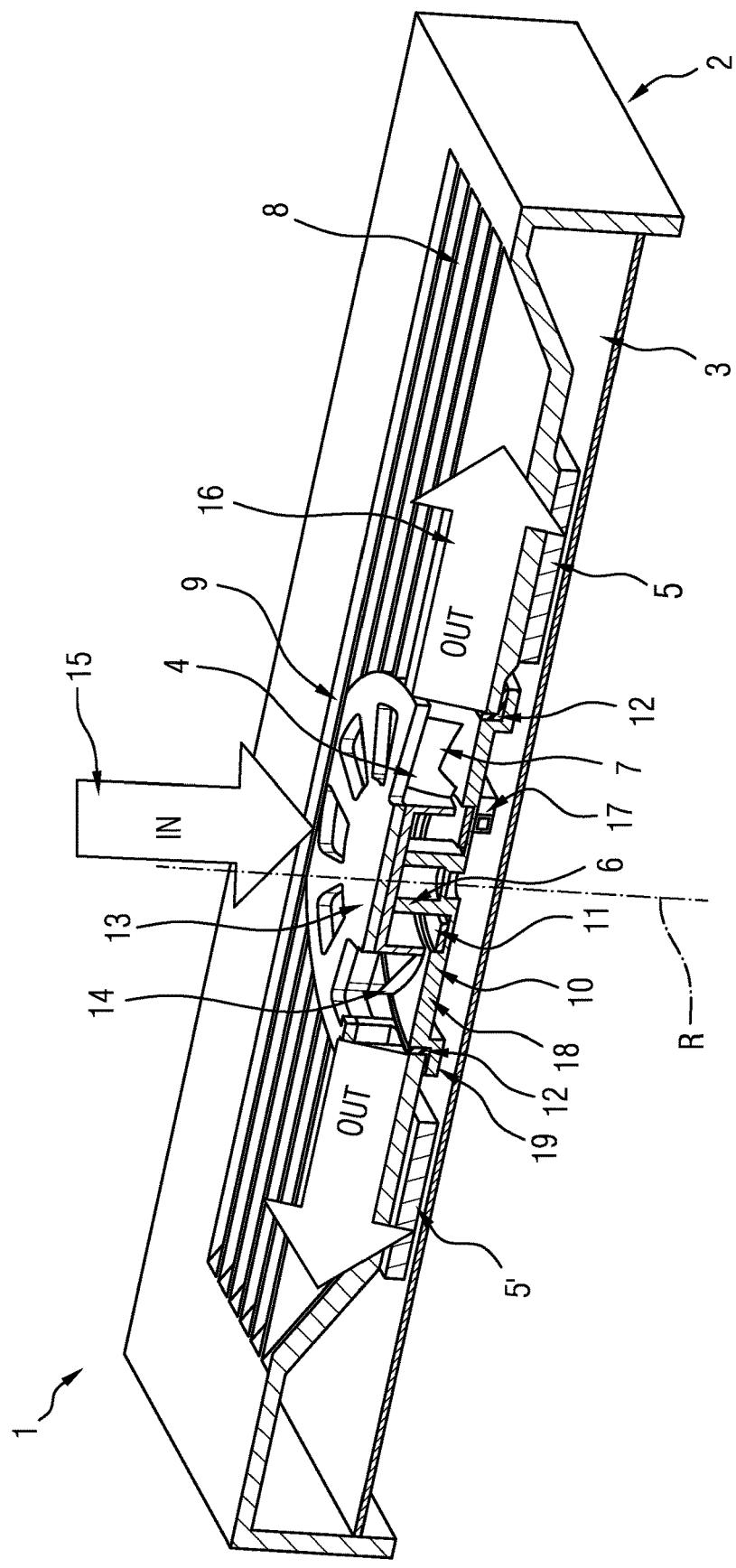
FIG. 2 schematically shows a second embodiment of an electronic device according to the disclosure.

FIG. 2 schematically shows a second embodiment of an electronic device 1 according to the disclosure. The embodiment illustrated in FIG. 2 differs from that illustrated in FIG. 1 in that the chamber 14 illustrated in FIG. 2, which is formed by the housing 2 of the electronic device 1 and the main body 10, is arranged between cooling fins of the heat sink 8. Here, the cooling fins of the heat sink 8 adjoin the chamber 14 and extend from the chamber 14 in two opposite directions perpendicular to the axis of rotation R of the fan rotor 7. In this way, heat is dissipated from electronic components 5, 5' which are arranged to several sides of the chamber 14 in the interior of the housing 2 on a device circuit board 3 and which are thermally coupled to the heat sink 8. The partially encircling wall 9 is, in FIG. 2, formed by cooling fins of the heat sink 8 which extend along the chamber 14. In FIG. 2, the cover 13 of the chamber 14 comes to lie at or on the cooling fins, which adjoin the chamber 14, of the heat sink 8, and is integrally connected to said cooling fins. In FIG. 2, the cover 13 has a multiplicity of openings in the form of trapezoidal slots.

In FIG. 2, the fan 4 is configured as a diagonal fan. It may alternatively also be configured as an axial fan.

Furthermore, the main body 10 is composed of a multi-constituent injection-molded component and has two injection-molded constituents 18, 19. The first injection-molded constituent 18 is of plate-like form and has electrically and thermally conductive material, for example polycaprolactam. The second injection-molded constituent 19 is of ring-shaped form and has an electrically conductive and acoustically damping material, for example a thermoplastic and electrically conductive elastomer. Alternatively, the second injection-molded constituent 19 may, like the first injection-molded constituent 18, be of plate-like configuration. The bushing 6 is arranged on the first injection-molded constituent 18. The main body 10 is directly connected by way of the second injection-molded constituent 19 to the housing 2 of the electronic device 1. The connection of main body 10 and housing 2 is realized by way of an electrically conductive adhesive connection 12 in the form of an adhesive layer that is arranged in an L-shaped transition region of the first injection-molded constituent 18 and the second injection-molded constituent 19.

In FIG. 2, the fan circuit board 11 is furthermore directed into the interior of the chamber 14. The fan circuit board 11 is in this case arranged between main body 10 and stator or fan rotor 7. Here, all electronic and sensor components of the fan are situated on the fan circuit board 11. Alternatively, electronic components of the fan may also be accommodated on the device circuit board 3 in the interior of the housing 2.

Figure 3:
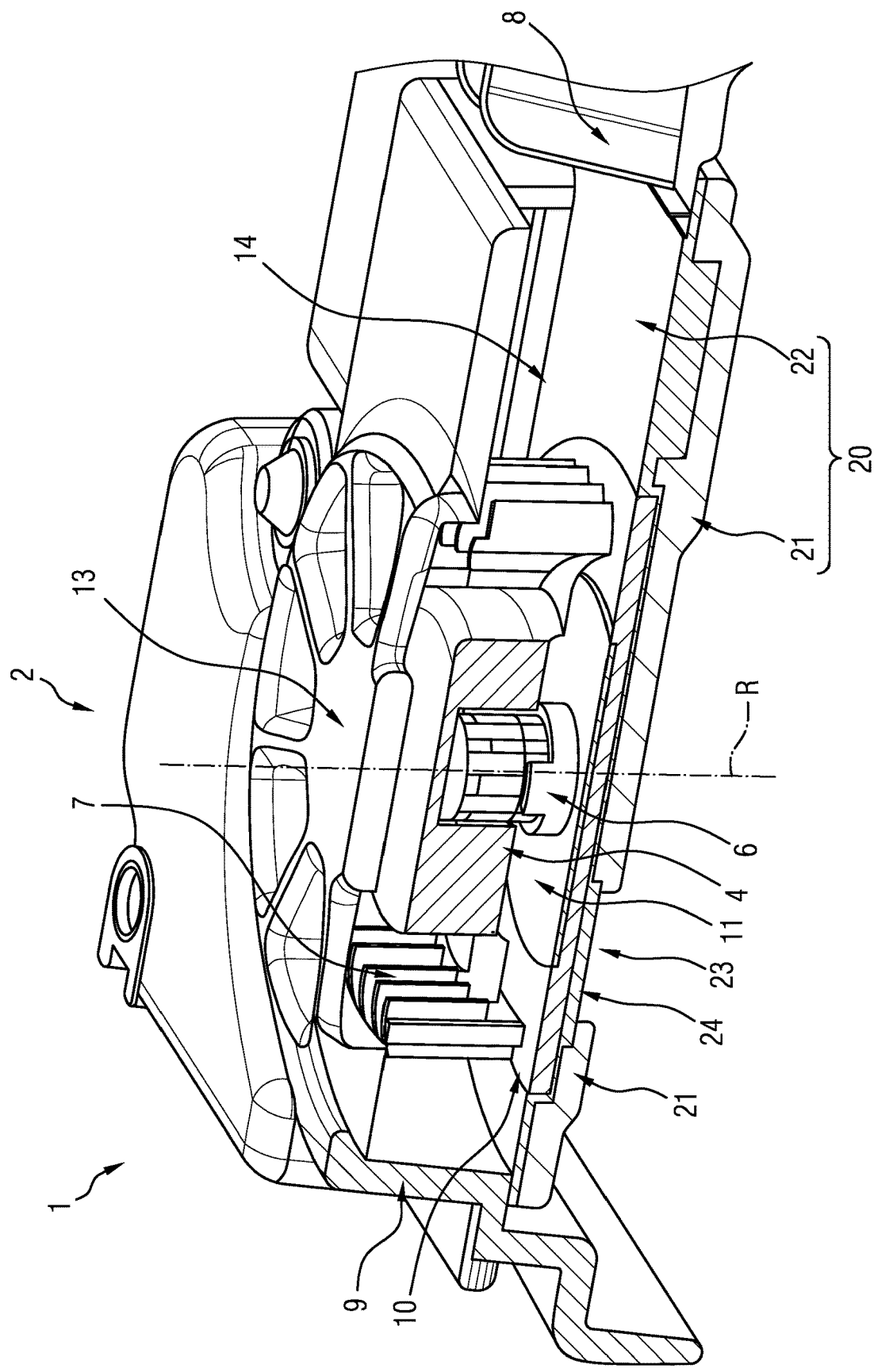
FIG. 3 Schematically Shows a Third Embodiment of an Electronic Device According to the Disclosure.
Figure 4:
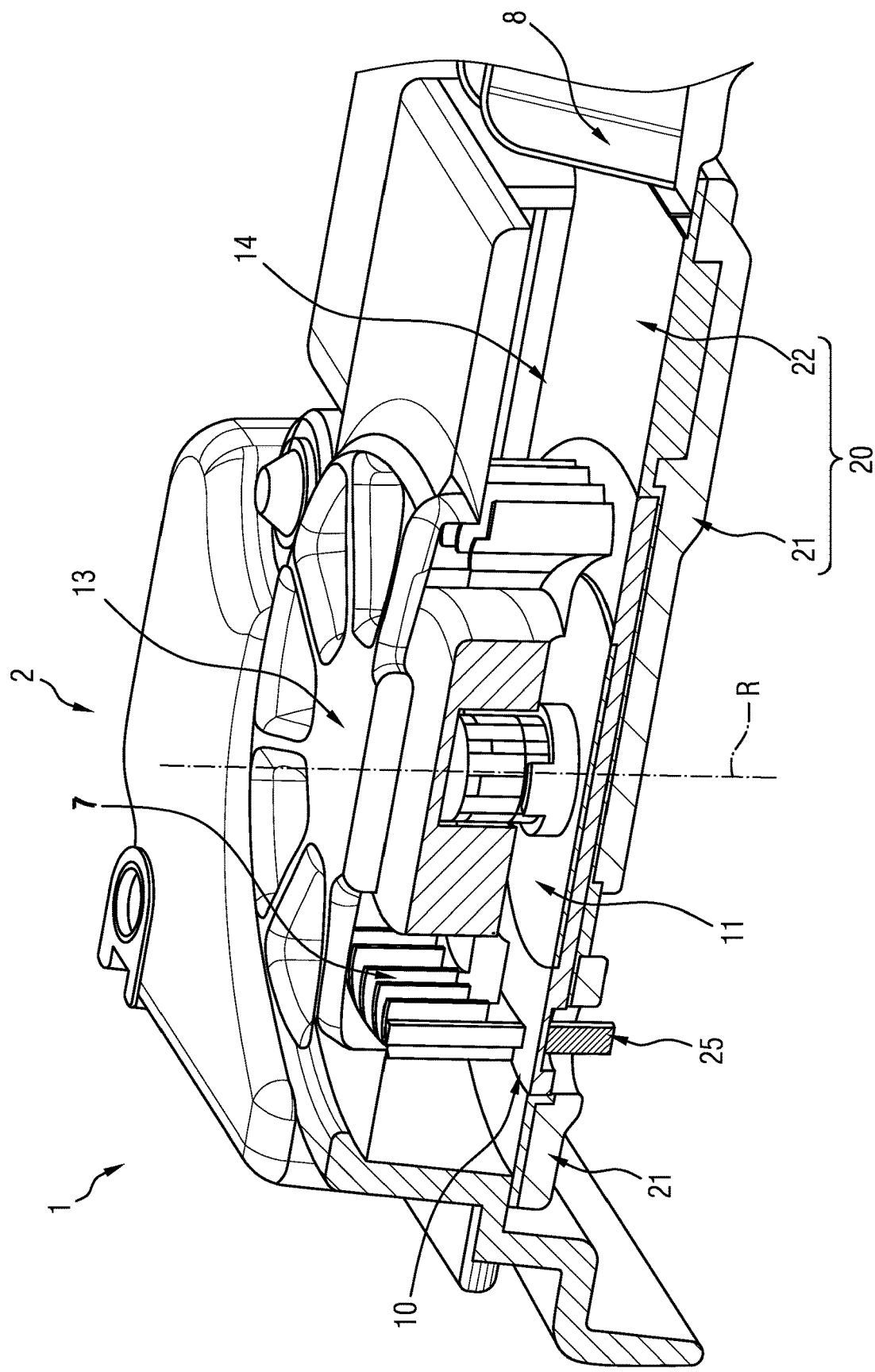
FIG. 4 shows the third embodiment illustrated in FIG. 3, in a slightly different view.

FIGS. 3 and 4 schematically show a third embodiment of an electronic device 1 according to the disclosure. FIG. 4 differs here from FIG. 3 by showing a slightly different view of the third embodiment. For the sake of clarity, the device circuit board and electrical component are not illustrated in FIGS. 3 and 4. The embodiment illustrated in FIGS. 3 and 4 differs from the embodiment illustrated in FIG. 1 in that the main body 10 and the housing 2 are indirectly connected to one another. Here, the main body 10 and housing 2 are connected to one another by way of a plate-like adapter element 20. Here, the main body 10 is connected to the adapter element 20 and the adapter element 20 is connected to the housing 2. In the embodiment illustrated in FIGS. 3 and 4, an opening to the interior of the housing 2 is closed off by the adapter element 20 when the housing 2 and main body 10 are in a connected state.

The adapter element 20 is composed of a multi-constituent injection-molded component and has a first portion 21 and a second portion 22. Here, the two portions 21, 22 are of plate-like form. The first portion 21 is composed of an electrically and thermally conductive material, in this case an electrically and thermally conductive plastic. The second portion 22 is composed of an electrically conductive and acoustically damping material, in this case a thermoplastic and electrically conductive elastomer. The first 21 and the second portion 22 are arranged in a layered manner relative to one another, wherein, when the main body 10 and housing 2 are in a connected state, the second portion 22 is arranged in the direction of the chamber 14 and the first portion 21 is arranged in the direction of the interior of the housing 2. When the housing 2 and main body 10 are in the connected state, the housing 2 bears against the second portion 22. The connection of main body 2 and adapter element 20 is performed here by way of calking. As can be seen in the illustration of FIG. 4, as a fastener, use is made of a calking pin 25 which in this case is formed as an integral constituent part of the main body 10 and which is driven through the two portions 22, 23 of the adapter element 20. During operation of the fan 4, acoustic decoupling between the housing 2 and a fan assembly, which has a main body 10, a bushing 6, a fan rotor 7, a stator (not illustrated) and a fan circuit board 11, is realized by way of the elastomer material of the second portion 22. Here, during the operation of the fan 4, the calking pin 25 allows a vibration along the extent of the calking pin 25, which vibration is attenuated in acoustically dampened fashion by the elastomer material of the second portion 22. A connection of housing 2 and adapter element 20 is realized here by way of a screw connection.

In FIGS. 3 and 4, the fan circuit board 11 is, as in the embodiment illustrated in FIG. 2, directed into the interior of the chamber 14. The fan circuit board 11 is in this case arranged between main body 10 and stator or fan rotor 7. Here, all electronic and sensor components of the fan 4 are situated on the fan circuit board 11. Alternatively, electronic components of the fan 4 may also be accommodated on the device circuit board 3 in the interior of the housing 2. Here, the electrical contacting of the fan circuit board 11 with the device circuit board is realized by way of a cable and plug connection (not illustrated). Here, the cable for the electronic contacting with the device circuit board is arranged on a side of the fan circuit board 11 that is directed toward the interior of the housing 2. The cable is led through an opening within the main body 10, which opening is concealed in the direction of the chamber 14 by the fan circuit board 11. The second portion 22 of the adapter element 20 is arranged so as to adjoin the main body 10. The second portion 22 has, for the leadthrough of a cable, a slotted leadthrough 24 which, owing to the elastomer material used, nestles against the led-through cable and substantially closes an opening in the second portion 22. For the leadthrough of the cable through the first portion 21, the latter has an opened region 23 adjoining the leadthrough 24 in the second portion 22. This can be seen in particular from FIG. 3.

Owing to the configuration of the adapter element 20 with a first portion 21 and a second portion 22, the main body 10 and the bushing 6 can be formed as a single-piece injection-molded component and produced from a relatively inexpensive material, for example from a plastic without special electrically conductive characteristics.

A further difference in relation to the embodiment illustrated in FIG. 1 consists in that the cover 13 in the embodiment illustrated in FIGS. 3 and 4 has a multiplicity of openings in the form of trapezoidal slots.

The invention claimed is:

1. An electronic device comprising:
a housing;
at least one device circuit board;
a heat sink; and
a fan with a fan rotor,
wherein the at least one device circuit board is arranged in an interior of the housing and has at least one electronic component,
wherein the at least one electronic component implements a function of the electronic device,
wherein the heat sink absorbs heat from the at least one electronic component and is cooled by an air stream generated by the fan rotor and which flows over the heat sink,
wherein the housing is connected to a main body of the fan,
wherein, when the main body and the housing are in a connected state, an opening to the interior of the housing is closed off,
wherein the main body is connected to a bushing on which the fan rotor is mounted for rotation,
wherein, in the connected state, a chamber is formed which is separated from the interior of the housing and in which the fan rotor is arranged,
wherein the chamber forms a housing for the fan rotor,
wherein the main body and housing are connected to one another by an adapter element, and
wherein the adapter element is composed of a multi-constitutent injection-molded component, having a first portion which has an electrically and thermally conductive material, and a second portion, which has an electrically conductive and acoustically damping material.

2. The electronic device as claimed in claim 1, wherein the fan is configured as an axial fan, wherein the axis of rotation of the fan rotor of the axial fan runs in a direction perpendicular to the direction of extent of a region, to which the main body is connected and on which the heat sink is arranged, of the housing.

3. The electronic device as claimed in claim 1, wherein the fan is configured as a diagonal fan, wherein the axis of rotation of the fan rotor of the diagonal fan runs in a direction perpendicular to the direction of extent of a region, to which the main body is connected and on which the heat sink is arranged, of the housing.

4. The electronic device as claimed in claim 1, wherein the fan is configured as a radial fan, wherein the axis of rotation of the fan rotor of the radial fan runs in a direction perpendicular to the direction of extent of a region, to which the main body is connected and on which the heat sink is arranged, of the housing.

5. The electronic device as claimed in claim 1, wherein the chamber is designed so as to form, for the fan, an air inlet from a direction parallel to the axis of rotation of the fan rotor and an air outlet substantially perpendicular to the axis of rotation of the fan rotor, and wherein the heat sink is arranged at the air outlet.

6. The electronic device as claimed in claim 1, wherein, to form the chamber, the housing has a wall, which partially encircles the fan rotor, and a cover, wherein the wall has at least one aperture at a location at which the heat sink is arranged, wherein the cover comes to lie on the wall and has a multiplicity of openings that form an air inlet for the fan.

7. The electronic device as claimed in claim 1, wherein, to form the chamber, the housing has a cover with a multiplicity of openings, wherein the cover comes to lie at or on cooling fins, which are arranged at the air outlet, of the heat sink.

8. The electronic device as claimed in claim 1, wherein the chamber is arranged between cooling fins of the heat sink, wherein the cooling fins adjoin the chamber and extend from the chamber in two opposite directions perpendicular to the axis of rotation of the fan rotor.

9. The electronic device as claimed in claim 1, wherein the main body is composed of an electrically conductive material.

10. The electronic device as claimed in claim 1, wherein the main body and the housing have an electrically conductive connection.

11. The electronic device as claimed in claim 1, wherein the main body and the housing have an electrically conductive adhesive connection.

12. The electronic device as claimed in claim 1, wherein the main body and the housing have an electrically conductive and acoustically damping adhesive connection.

* * * * *